United States Patent [19]

Hazard et al.

[11] Patent Number: 5,610,613
[45] Date of Patent: Mar. 11, 1997

[54] ANALOG TO DIGITAL CONVERSION SYSTEM

[75] Inventors: Robert W. Hazard, Tewksbury; George A. Bouchard, Arlington; Jeffrey E. Carmella, Acton; Michael P. DeMilia, Lancaster, all of Mass.

[73] Assignee: Raytheon Company, Lexington, Mass.

[21] Appl. No.: 528,571

[22] Filed: Sep. 15, 1995

[51] Int. Cl.$^6$ ....................................... G01S 7/28
[52] U.S. Cl. ........................ 342/195; 342/95; 342/115; 342/135
[58] Field of Search ................................ 342/194, 195, 342/197, 94, 95, 115, 135

[56] References Cited

U.S. PATENT DOCUMENTS

| | | | |
|---|---|---|---|
| 4,783,660 | 11/1988 | Pierce | 342/101 |
| 5,049,885 | 9/1991 | Orr | 342/20 |
| 5,194,870 | 3/1993 | Pearce et al. | 342/128 |
| 5,305,007 | 4/1994 | Orr et al. | 342/20 |
| 5,323,332 | 6/1994 | Smith et al. | 364/571.01 |
| 5,361,072 | 11/1994 | Barrick et al. | 342/133 |
| 5,389,931 | 2/1995 | Anderson et al. | 342/70 |
| 5,461,389 | 10/1995 | Dean | 342/375 |

*Primary Examiner*—John B. Sotomayor
*Attorney, Agent, or Firm*—Donald F. Mofford

[57] ABSTRACT

A system for obtaining digitized samples of an analog signal at a selectable rate, R. The system includes: a timing generator for producing a train of sampling pulses at a predetermined sampling rate, $f_s$; an analog to digital converter for producing a digitized sample of the analog signal in response to each one of the sampling pulses; a processor; and, a selector, for passing each Nth one of the digitized samples produced by the analog to digital converter, where $N=f_s/R$ to the processor. The selector includes a decimator, responsive to a signal, $N=f_s/R$, representative of the ratio of the sampling rate, $f_s$, to the digitized signal obtaining rate, R, for producing pulses at the rate, $R=f_s/N$; and, a register for storing each Nth one of the digitized samples produced by the analog to digital converter, each one of such digitized samples being stored in response to a corresponding one of the pulses produced by the decimator. A radar system is provided wherein range cells signals of the video signals produced in response to a train of transmitted pulses are obtained at a rate, R, related to the range cell resolution selected by the radar system. An analog to digital conversion system is fed by the video signal. The analog to digital conversion system includes: a timing generator for producing a train of sampling pulses at a predetermined sampling rate, $f_s$; an analog to digital converter for producing a digitized samples of the analog signal in response to each one of the sapling pulses; and, a processor section for processing each Nth one of the digitized samples produced by the analog to digital converter.

5 Claims, 2 Drawing Sheets

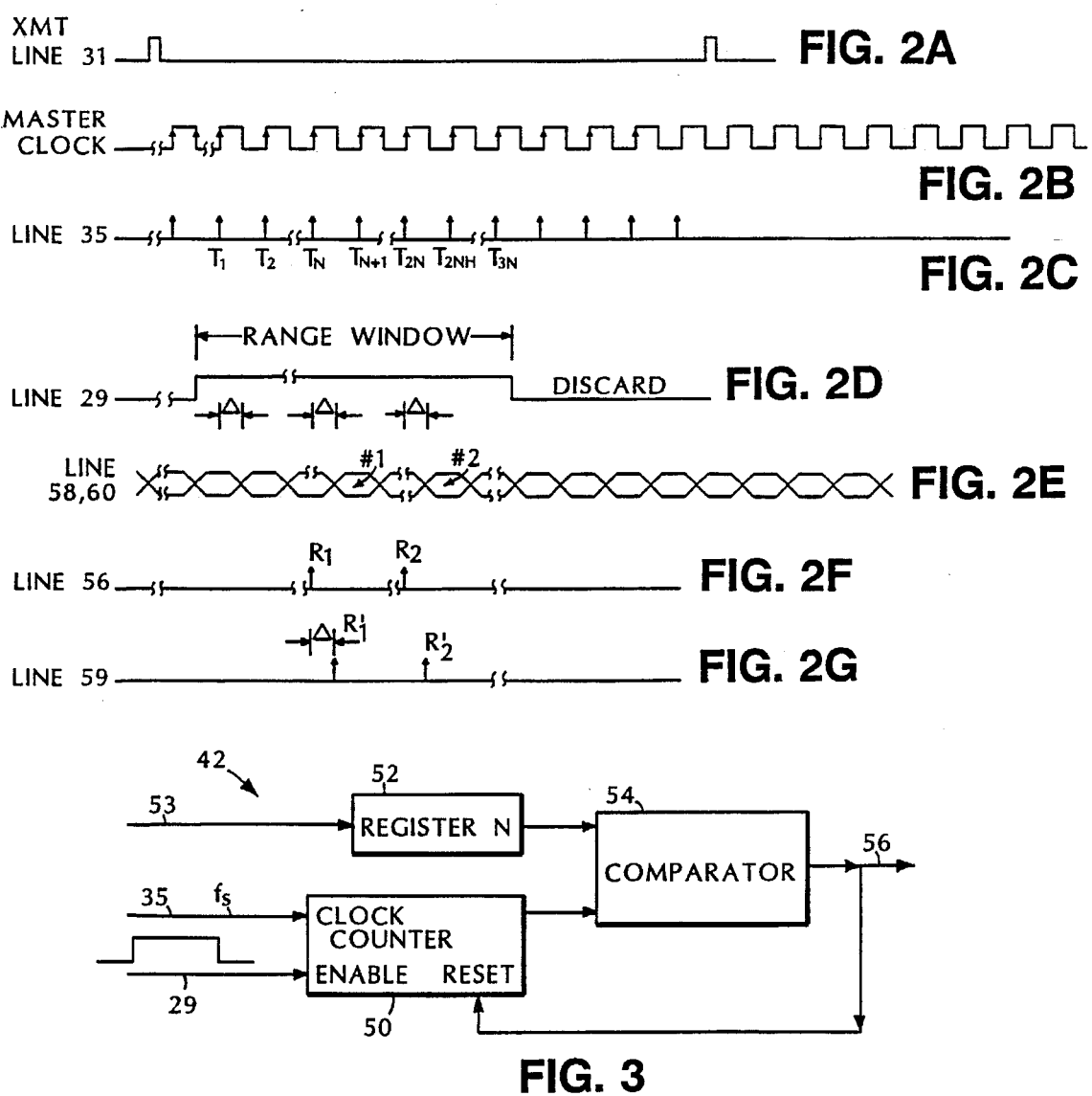

ANALOG TO DIGITAL CONVERSION SYSTEM

BACKGROUND OF THE INVENTION

This invention relates to analog to digital conversion systems and more particularly to analog to digital conversion systems required to provide digitized samples of an analog signal over a wide range of selectable rates.

As is known in the art, various systems, such as radar systems, require, in application where digital signal processors are used to process radar return signals, conversion of the analog radar returns signals into corresponding digital signals. For example, radar signal processors are used for determining the range and/or relative velocity, or velocities, associated with one, or more, objects. Radar pulses are transmitted at a rate referred to as the pulse repetition frequency (PRF). During a predetermined time after pulse transmission, i.e., the expected time of arrival of the pulses, radar return signals are sampled. Based on the difference in time between the time of pulse transmission and the time at which the sample is taken, each one of the samples would correspond to a range, or distance between the radar system antenna and the object producing the sampled return. The rate at which the samples are taken following each transmitted pulse is directly related to the desired range resolution. The process is referred to as range gating, where each time a sample is taken represents a range cell, or gate, of the return produced by the object at the range corresponding to the time the sample is taken. As is also known in the art, in some applications it is necessary to have the radar system operate over a broad range of pulse repetition frequencies. Further, in some applications, it is necessary to have the samples taken at many different sampling rates for a broad range of range resolutions. One system used to produce the digitized samples includes an analog to digital converter. With such converter, a sample of the video signal is taken and converted into a corresponding digital sample in response to a sampling signal. In order to accommodate the variation in sampling/conversion rates, the analog to digital converter has to be capable of operating over this relatively large range of sampling/conversion rates.

SUMMARY OF THE INVENTION

In accordance with the invention, a system is provided for processing digitized samples of an analog signal at a selectable rate, R. The system includes a timing generator for producing a train of sampling pulses at a predetermined sampling rate, $f_s$; an analog to digital converter for producing a digitized sample of the analog signal in response to each one of the sampling pulses; and, a processor section for processing each Nth one of the digitized samples produced by the analog to digital converter, where $N=f_s/R$, where N is an integer.

With such arrangement, the analog to digital converter operates at a continuous, relatively high, constant sampling rate, $f_s$, while the processing section processes each Nth one of the digitized samples, where $N=f_s/R$, and R is the selectable sampling rate. Thus, a wider selection of analog to digital converters, including relatively inexpensive analog to digital converters, may be used as compared with analog to digital converters which must digitize analog samples over the range of selectable rates, R.

In accordance with another feature of the invention, the system includes: a timing generator for producing a train of sampling pulses at a predetermined sampling rate, $f_s$; an analog to digital converter for producing a digitized sample of the analog signal in response to each one of the sampling pulses; a processor; and, a selector, for passing each Nth one of the digitized samples produced by the analog to digital converter to the processor, where $N=f_s/R$.

In accordance with another feature of the invention, the selector includes: a decimator, responsive to a signal, $N=f_s/R$, representative of the ratio of the sampling rate, $f_s$, to the digitized signal obtaining rate, R, for producing pulses at the rate, $R=f_s/N$; and, a register for storing each Nth one of the digitized samples produced by the analog to digital converter, each one of such digitized samples being stored in response to a corresponding one of the pulses produced by the decimator. The samples stored by the register are then fed to the processor.

In accordance with another feature of the invention, a radar system is provided wherein range cells samples of the video signals produced in response to a train of transmitted pulses are obtained at a selectable rate, R, related to the range cell resolution selected by the radar system. An analog to digital conversion system is fed by the video signal. The analog to digital conversion system includes: a timing generator for producing a train of sampling pulses at a predetermined, continuous, constant, sampling rate, $f_s$; an analog to digital converter for producing a digitized sample of the analog signal in response to each one of the sampling pulses; and, a processor section for processing each Nth one of the digitized samples produced by the analog to digital converter following each transmitted pulse, where $N=f_s/R$, and for determining Doppler frequency of energy in the range cells from the processed digitized samples.

In accordance with still another feature of the invention, a radar system is provided for obtaining digitized range cell samples of video signals produced in response to a series of transmitted pulses, such digitized samples being obtained at a selected rate for a range cell resolution desired by the radar system. Each transmitted pulse is produced in response to a radar transmit trigger signal. Digitized samples of the video signal are produced in response to a train of sampling pulses having a sampling frequency, $f_s$. A gating window pulse is produced a predetermined time after each trigger signal. A digital processing section processes each Nth one of the digitized samples produced by the analog to digital converter during the time duration of the gating window to determine the Doppler frequency of energy in the range cells from the processed digitized samples produced during the time duration of the gating window.

BRIEF DESCRIPTION OF THE DRAWING

FIGS. 2A–2G are timing diagrams useful in understanding the operation of the radar system of FIG. 1; and, FIG. 3 is a functional block diagram of a decimator used in the radar system of FIG. 1.

DESCRIPTION OF THE PREFERRED EMBODIMENTS

Figure 1:
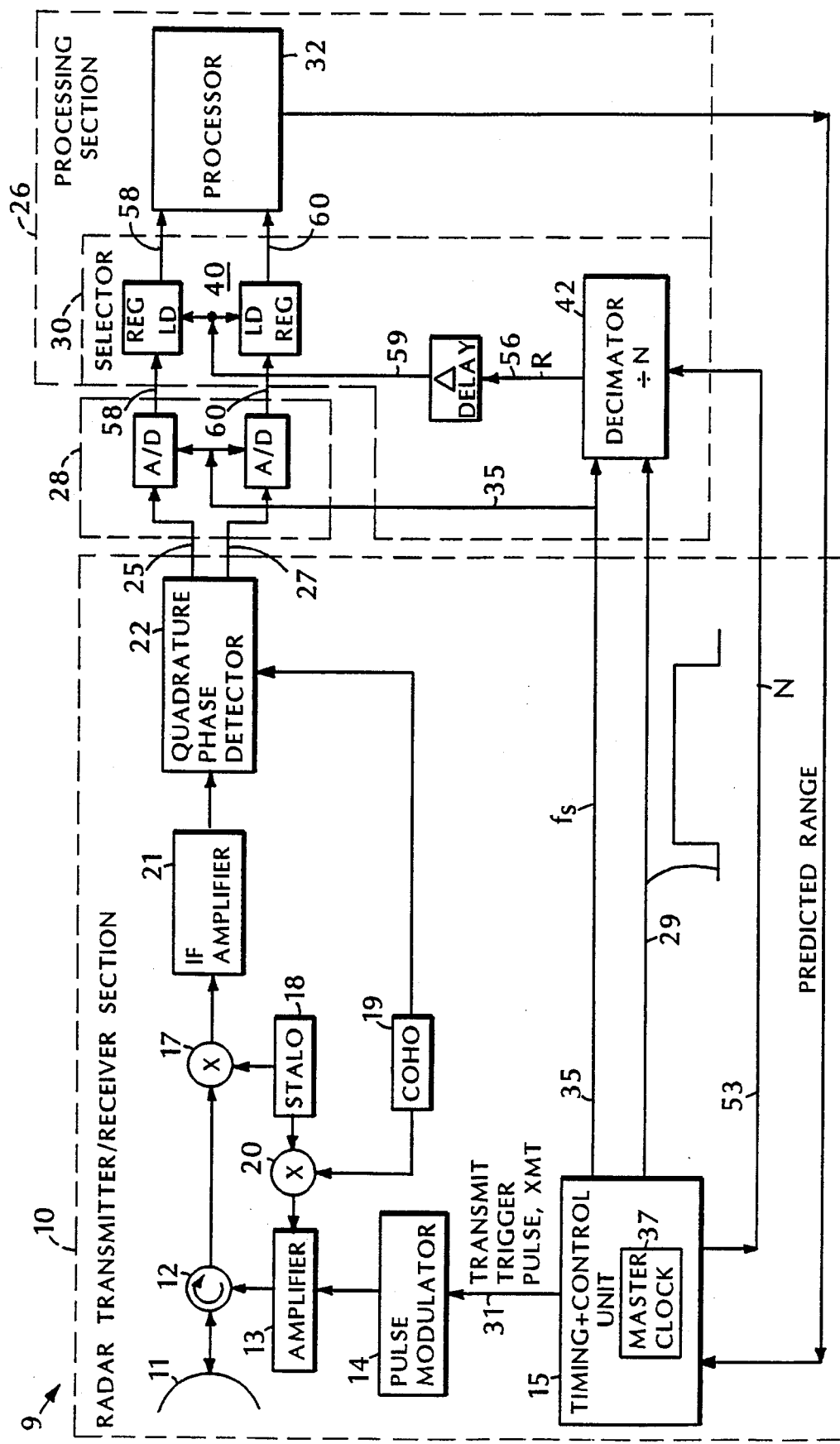
FIG. 1 is a block diagram of a radar system according to the invention.

Referring now to FIG. 1, a coherent Doppler radar system 9, is shown. The radar transmitter/receiver section 10 of the radar system 9 includes an antenna 11 coupled through a circulator 12 to an amplifier, here, for example, a klystron amplifier 13, a pulse modulator 14 and a timing and control unit 15 arranged in a conventional manner whereby a train of pulses of radio frequency (RF) energy is transmitted at a desired pulse repetition frequency (PRF). Here, the radar system 9 is adapted to produce transmitted pulses with different pulse repetition frequencies. Each one of the pulses in the train of transmitted pulses is reflected by various objects which are dispersed over various ranges from the antenna 11. A portion of the reflected energy produced in response to each transmitted pulse, is received by antenna 11. The time at which a portion of such energy is received relative to the time at which the transmitted pulse associated therewith is transmitted corresponds to the range of the object causing such portion of the received energy. The energy received by the antenna 11 passes thorough circulator 12. The signal at the output of circulator 12 is heterodyned in mixer 17 in a conventional manner by a stable local oscillator (STALO) 18. The signal produced by STALO 18 is heterodyned with a signal produced by a coherent local oscillator (COHO) 19 in a mixer 20 to produce a signal which is amplified by klystron amplifier 13 in a conventional manner. The signal produced at the output of mixer 17 is passed through IF amplifier 21 to a conventional quadrature phase detector 22. Quadrature phase detector 22 responds in a conventional manner to the signals fed thereto from IF amplifier 21 and a reference signal supplied by the COHO 19 to produce a pair of video signals on lines 25, 27, generally referred to as the "in phase" video and "quadrature" video signal, respectively. The "in phase" and "quadrature" video signals are therefore representative of the phase shift of the received signals after being heterodyned to intermediate frequency (IF) signals by mixer 17 and the reference signal produced by the COHO 19. The rate of change in the levels of the "in phase" and "quadrature" signals at any selected time after a pulse is transmitted varies from pulse to pulse at a frequency related to the Doppler frequency of the object at the range corresponding to the selected time. The "in phase" and "quadrature" video signals are fed to a processing section 26, the details of which will be described. Suffice it to say here, however, that the processing section 26 is used, among other things, to determine the Doppler frequency of various objects illuminated by the radar system 9 and also to estimate the range to a desired object, i.e., a desired object, or target. Once the desired target is located, the timing and control unit 15 predicts from information determined by the processing section 26, the expected range of the target for the next transmitted pulse. That is, a prediction is made of the expected range of the target and, hence, the approximate return time of each target return. The timing and control unit 15 thereby produces a dwell, or gating window pulse on line 29 after each transmitted pulse, i.e. after each trigger signal, XMT, on line 31, during which returns from the target are expected.

The processing section 26 includes an analog to digital converter section 28, a selector 30, and a processor 32, arranged as shown. Briefly, analog to digital converter section 28 produces digitized samples of video signals at a continuous, relatively high, constant rate, $f_s$. That is, the sampling frequency remains constant, independent of the pulse repetition frequency and independent of the range resolution cell. Only each Nth one of the digitized samples is processed by the processor section 26, where $N=f_s/R$ and R is the rate at which the range cells of the video signal are to be processed; i.e., R is selected in accordance with the desired range cell resolution. Thus, only each Nth one of the digitized samples are passed to the processor section 26 for processing therein, such processed samples being passed to the processor at the rate, R, selected in accordance with the range cell resolution desired by the radar system 9. Thus, the range resolution cell is selected, in any conventional manner, by the timing and control unit 15. Here the range resolution may be at a rate, R, from $f_s$ to $f_s/N$, where N is an integer. That is, during a target acquisition mode, the range cell resolution may be large, i.e., N is a large integer; whereas, once the target has been acquired and the radar system enters a target tracking mode, a small range resolution may be desired, in which case N=1.

More particularly, and referring also to FIGS. 2A–2F, each transmitted pulse, XMT, on line 31 is produced in response to a radar transmit trigger signal, as shown in FIG. 2A. Digitized samples of the video signals on lines 25, 27 produced by the quadrature phase detector 22 are produced by the analog to digital conversion section 28 in response to a train of sampling pulses, $f_s$, on line 35. The sampling pulses, i.e., here, for example, the rising edges of the pulses from the master clock 37 in the timing and control unit 15 are represented as pulses, shown in FIG. 2C. The sampling pulses are produced on line 35 have a sampling frequency, $f_s$. The sampling pulses are produced on line 35 continuously at a fixed sampling frequency, $f_s$, such frequency, $f_s$, being high enough to provide the highest expected range cell resolution desired by the radar system. Thus, rather than sampling only in short bursts of varying sampling rates, the sampling pulses fed to the analog to digital converter section are continuous in time and at a constant rate, here $f_s$. A gating window pulse (FIG. 2D) is produced by the timing and control unit 15 on line 29 a predetermined time after each transmit pulse trigger signal on line 31, XMT. The digital processing section 26 processes each Nth one of the digitized samples produced by the analog to digital converter section 28 during the time duration of the gating window pulse on line 29 to determine the Doppler frequency of energy in the range cells from the obtained digitized samples during the time duration of the gating window. Further, because of the gating window signal on line 29, digital samples obtained during periods of time outside of the gating window are also discarded by the processing section 26.

More particularly, the processing section 26 includes the analog to digital converter section 28, a register section 40, a decimator 42 and the signal processor 32. The decimator 42, functional shown in FIG. 3, includes a counter 50. The counter 50 counts signals fed to the clock input thereof via line 35, i.e., the sampling pulses on line 35 having the rate $f_s$. The counter 50 is enabled during the time duration of the gating window on line 29. The decimator 42 includes a register 52 for storing the integer, N, produced by the timing and control unit 15 on line 53. As noted above, the integer, N, is related to the range resolution desired by the radar system 9. The count of the counter 50 is initially reset to a count of zero. When enabled, the count of counter 50 increments in response to each one of the sampling pulses on line 35. When the count increments to N, a comparator 54 produces an output pulse on line 56 (FIG. 2F) to: reset the count of the counter 50 to zero; and, enable register section 40 to store (i.e. load, LD), after a time delay, Δ, the digitized sample available at the output of the analog to digital converter section 28 (i.e., the digitized samples available on lines 58, 60, as shown in FIGS. 2E and 2F). Thus, pulses, $R_1$, $R_2$, . . . (FIG. 2F) are produced by the decimator 42 on line 56 at the selected rate, R, where $R=f_s/N$. Because of the gating window signal on line 29, digital samples obtained during periods of time outside of the gating window are also discarded by the processing section 26. Further, it should be noted that because of the time delay, Δ, in the analog to digital converter section 28 converting the samples on line 25, 27 into digital samples, a corresponding delay, Δ is provided at the output of the decimator 42. Thus, when a pulse $R_1, R_2, \ldots$ (FIG. 2F) is produced by the decimator 42 on line 56, a pulse $R'_1, R'_2, \ldots$ (FIG. 2G) is produced on line 59 after a time delay, Δ. The pulses on line 59 are used to enable the register section 40 to store (i.e., load, LD) the digitized samples available on lines 58, 60, as shown in FIGS. 2E, 2F and 2G. Thus, the digital processor 32 has passed to it only each Nth one of the digitized samples produced by the analog to digital converter section 28 during the time duration of the gating window to determine, among other things, the Doppler frequency of energy in the range cells from the processed digitized samples produced during the time duration of the gating window.

Other embodiments are within the spirit and scope of the appended claims.

What is claimed is:

1. A radar system comprising:
    means for processing digitized samples of an analog signal at a selectable rate, R, for changing range cell resolution of the radar system comprising:
        a timing generator for producing a train of sampling pulses at a predetermined sampling rate, $f_s$;
        an analog to digital converter for producing a plurality of digitized samples of the analog signal in response to each one of the sampling pulses; and,
        a processor to determine a doppler frequency of a received signal in each Nth one of the digitized samples and, a selector for passing to the processor each Nth one of the digitized samples produced by the analog to digital converter, where $N=f_s/R$.

2. A radar system comprising:
    means for changing range cell resolution of a range cell of a radar system comprising:
        means for digitizing samples of video signals at a constant rate for providing a plurality of digitized samples; and
        means for selecting selected samples of the plurality of digitized samples for processing by a digital processing section for determining a doppler frequency of a received signal in the selected samples comprising:
            a selector, for passing each Nth one of the digitized samples produced by the analog to digital converter to the processor at a predetermined rate, R, where $N=f_s/R$.

3. The system recited in claim 2 wherein the selector comprises:
    a decimator, responsive to a signal, $N=f_s/R$, representative of the ratio of the sampling rate, $f_s$, to the digitized signal obtaining rate, R, for producing pulses at the rate, $R=f_s/N$; and,
    a register for storing each Nth one of the digitized samples produced by the analog to digital converter, each one of such digitized samples being stored in response to a corresponding one of the pulses produced by the decimator.

4. A radar system comprising:
    means for changing range cell resolution of the radar system, wherein range cells signals of the video signals produced in response to a train of transmitted pulses are obtained at a selectable rate, R, related to the range cell resolution desired by the radar system, such radar system including an analog to digital conversion system fed by the video signal, the analog to digital conversion system, comprising:
        a timing generator for producing a train of sampling pulses at a predetermined sampling rate, $f_s$;
        an analog to digital converter for producing a digitized samples of the analog signal in response to each one of the sampling pulses; and,
        a processor section including: a processor; and, a selector for passing to the processor each Nth one of the digitized samples produced by the analog to digital converter following each one of the transmitted pulses, where $N=f_s/R$, such processor processing each Nth one of the digitized samples produced by the analog to digital converter and passed thereto by the selector, where $N=f_s/R$, and for determining Doppler frequency of energy in the range cells from the processed digitized samples.

5. A radar system comprising:
    means for obtaining digitized samples of video signals produced in response to a series of transmitted pulses, such digitized samples being obtained at a selected rate, R, within a predetermined range of range cell obtaining rates, each transmitted pulse being produced in response to a radar transmit trigger signal, a gating window pulse being produced a predetermined time after each trigger signal, comprising:
        a digitizer section for producing digitized samples of the video signal in response to a train of sampling pulses having a sampling frequency, $f_s$, such sampling rate being related to the range cell resolution desired by the radar system;
    a digital processing section for processing each Nth one of the digitized samples produced by the analog to digital converter during the time duration of the gating window following each one of the transmitted pulse, where $N=f_s/R$, to determine the Doppler frequency of energy in the range cells from the obtained digitized samples during the time duration of the gating window.

* * * * *